(12) United States Patent
Namba et al.

(10) Patent No.: US 10,948,836 B2
(45) Date of Patent: *Mar. 16, 2021

(54) LIQUID DISPENSING APPARATUS MEASURING CONDITION OF LIQUID AND METHOD OF CONTROLLING THE SAME, AND IMPRINT APPARATUS

(71) Applicant: CANON KABUSHIKI KAISHA, Tokyo (JP)

(72) Inventors: Hisashi Namba, Utsunomiya (JP); Yuichi Takahashi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/748,378

(22) Filed: Jan. 21, 2020

(65) Prior Publication Data

US 2020/0166858 A1 May 28, 2020

Related U.S. Application Data

(63) Continuation of application No. 15/964,528, filed on Apr. 27, 2018, now Pat. No. 10,578,985.

(30) Foreign Application Priority Data

May 8, 2017 (JP) .............................. JP2017-092562

(51) Int. Cl.
*G03F 7/00* (2006.01)
*G03F 9/00* (2006.01)
(Continued)

(52) U.S. Cl.
CPC .......... *G03F 9/7042* (2013.01); *G03F 7/0002* (2013.01); *G03F 9/7088* (2013.01); *B82Y 10/00* (2013.01); *B82Y 40/00* (2013.01)

(58) Field of Classification Search
CPC ....... B82Y 10/00; B82Y 40/00; G03F 7/0002; G03F 9/7042; G03F 9/7088; B41J 2/2135; B67D 7/30
(Continued)

(56) References Cited

U.S. PATENT DOCUMENTS

| 7,531,821 | B2 | 5/2009 | Suehira et al. |
| 9,405,193 | B2 | 8/2016 | Kondo et al. |

(Continued)

FOREIGN PATENT DOCUMENTS

| JP | 2007-281072 A | 10/2007 |
| JP | 2008-100507 A | 5/2008 |
| JP | 2011-222705 A | 11/2011 |

*Primary Examiner* — Que Tan Le
(74) *Attorney, Agent, or Firm* — Venable LLP

(57) ABSTRACT

An imprint apparatus comprises: a dispensing unit that dispenses a liquid to a substrate; a first measurement unit that measures a time from when a signal for causing the liquid to be dispensed is outputted to the dispensing unit until when the dispensed liquid passes through a predetermined position; a second measurement unit that measures a position of the liquid on the substrate that is dispensed by the dispensing unit; and a control unit that controls the measurement by the first measurement unit and the second measurement unit, wherein the control unit performs measurement by the second measurement unit based on a measurement result by the first measurement unit.

22 Claims, 7 Drawing Sheets

(51) Int. Cl.
*B82Y 10/00* (2011.01)
*B82Y 40/00* (2011.01)

(58) Field of Classification Search
USPC .............................................. 250/559.4, 221
See application file for complete search history.

(56) References Cited

U.S. PATENT DOCUMENTS 10,168,615 B2 * 1/2019 Yamashita .............. B29C 43/34
10,376,915 B2   8/2019 Katsuta

* cited by examiner

STAGE MOVING
DIRECTION

STAGE MOVING
DIRECTION

LIQUID DISPENSING APPARATUS MEASURING CONDITION OF LIQUID AND METHOD OF CONTROLLING THE SAME, AND IMPRINT APPARATUS

CROSS-REFERENCE TO RELATED APPLICATIONS

This application is a continuation application of U.S. patent application Ser. No. 15/964,528, filed Apr. 27, 2018, which claims the benefit of Japanese Patent Application No. 2017-092562, filed May 8, 2017. Both prior applications are hereby incorporated by reference herein in their entirety.

BACKGROUND OF THE INVENTION

Field of the Invention

The present invention relates to an imprint apparatus and a method of controlling the same.

Description of the Related Art

An imprinting technique is a technique for enabling a transfer of a fine pattern on a nanoscopic scale, and is used practically as one nano-lithography technique for volume production of magnetic storage mediums and semiconductor devices. In an imprinting technique, a fine pattern is formed on a substrate such as a silicon wafer, a glass plate, or the like using, as an original, a mold on which a fine pattern is formed by using an apparatus such as an electron beam exposure apparatus. This fine pattern is formed by applying an imprint resin onto the substrate, and causing that resin to be cured in a state in which the pattern of the mold is pressed onto the substrate via the resin.

Conventional imprinting techniques include a heat cycle method and a photocuring method. In a heat cycle method, a thermoplastic imprint resin is heated to a temperature greater than or equal to a glass-transition temperature, and a mold is pressed on substrate via a resin in a state in which fluidity of the resin is heightened. Then a pattern is formed by detaching the mold from the resin after cooling. Also, in a photocuring method, an imprint resin of an ultraviolet light curing type is used, and the resin is cured by irradiating ultraviolet light in a state in which a mold is pressed to a substrate via the resin. Then the pattern is formed by detaching the mold from the resin after curing. A heat cycle method is accompanied by an increase in transfer time due to temperature control and a decrease of dimensional precision due to temperature change. In contrast to this, no such problem exists in the photocuring method. Thus, the photocuring method is advantageous in volume production of semiconductor devices on a nanoscopic scale.

In a case where an apparatus for volume production of semiconductor devices or the like is assumed, there is a demand that a resin be applied at a desired position and transfer of a pattern be performed in an imprint apparatus in which resin application and pattern transfer are repeated for every pattern transferred region on a substrate, for example. In particular, in the case where a resin is applied to a substrate by an ink-jet method, properties of individual nozzles for applying the resin fluctuate according to a temporal change, and the position at which the resin is applied on the substrate shifts. A method of measuring a resin landing position shift amount based on a result of measuring resin applied on a substrate in order to detect shift of resin applied on a substrate, and correcting the resin landing position shift amount has been disclosed (for example, Japanese Patent Laid-Open No. 2011-222705).

In a case where a resin landing position shift is corrected based on a result of measuring a resin applied on a substrate, it is necessary to set a measuring substrate on a substrate stage at each of given decided time intervals, and measure landing position shift. For that reason, fluctuation in nozzle properties that arises between measurements cannot be detected, and until the next measurement, pressing ends up being performed with the resin applied at a shifted position. Shortening the measurement interval in order to increase a real-time nature can be considered, but in such a case, productivity will decrease since the number of measurements will increase.

SUMMARY OF THE INVENTION

According to one aspect of the present invention, there is provided an imprint apparatus, comprising: a dispensing unit configured to dispense a liquid to a substrate; a first measurement unit configured to measure a time from when a signal for causing the liquid to be dispensed is outputted to the dispensing unit until when the dispensed liquid passes through a predetermined position; a second measurement unit configured to measure a position of the liquid on the substrate that is dispensed by the dispensing unit; and a control unit configured to control the measurement by the first measurement unit and the second measurement unit, wherein the control unit performs measurement by the second measurement unit based on a measurement result by the first measurement unit.

According to another aspect of the present invention, there is provided a method of controlling an imprint apparatus comprising a dispensing unit for dispensing a liquid to a substrate, the method comprising: performing a first measurement of a time from when a signal for causing the liquid to be dispensed is outputted to the dispensing unit until when the dispensed liquid passes through a predetermined position; and performing a second measurement of a position at which the liquid is dispensed by the dispensing unit onto the substrate, based on the measurement result by the first measurement.

By virtue of the invention of the present application, it is possible to improve the real-time nature of resin application position measurement while suppressing a decrease in throughput, and it becomes possible to apply resin at high precision to a desired region on a substrate.

Further features of the present invention will become apparent from the following description of exemplary embodiments (with reference to the attached drawings).

DESCRIPTION OF THE EMBODIMENTS

Figure 1:
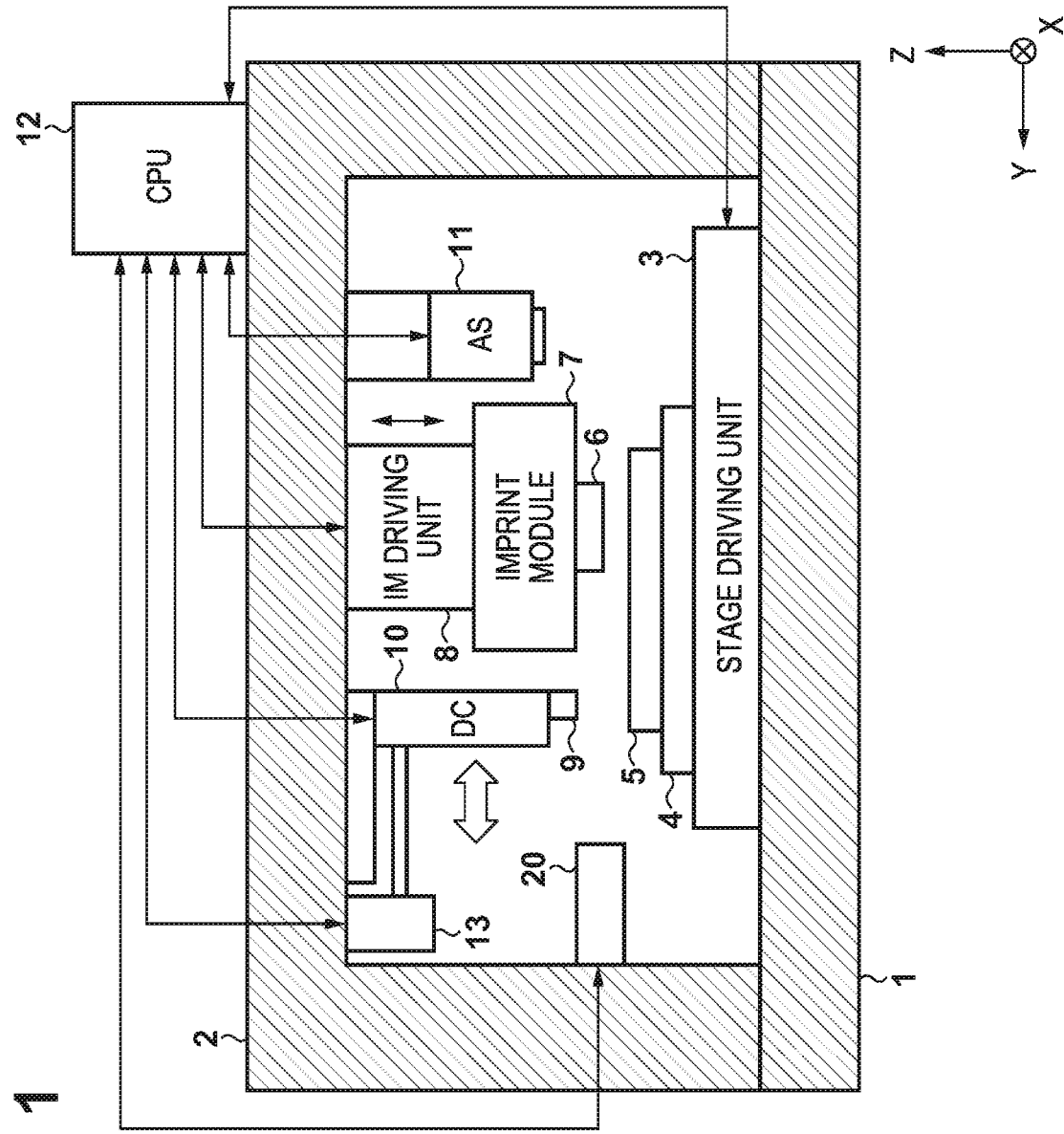
FIG. 1 is a schematic view of an imprint apparatus according to the present invention.

FIG. 1 is an overview configuration diagram for describing an embodiment of an imprint apparatus of the present invention. In FIG. 1, a substrate stage 4 is provided via a stage driving unit 3 configured by a linear motor or the like on a base 1. The substrate stage 4 holds a substrate 5, and is configured to be able to move. The stage driving unit 3 moves the substrate stage 4 in an X-axis direction and a Y-axis direction which are parallel to the top surface of the base 1. The substrate stage 4 maintains a sufficient position accuracy in relation to the base 1 by feeding back to the stage driving unit 3 position information detected by a means (not shown) such as an interferometer.

A frame 2 is provided on the base 1, and an imprint module 7 is attached to the frame 2 via an imprint module (IM) driving unit 8. The imprint module 7 holds a mold 6 facing the substrate 5, and has an ultraviolet light irradiation unit (not shown) internally. The mold 6 is configured by a material that transmits ultraviolet light, and an uneven pattern is formed on the surface facing the substrate 5. The IM driving unit 8 raises/lowers the imprint module 7 in a direction (a Z-axis direction in the figure) that is perpendicular to the surface of the substrate 5, and performs operations for pressing the mold 6 to a resin (imprint material) applied on the substrate 5, and separating the mold 6 from the substrate 5.

Also, in the frame 2, a dispenser 9 which is a resin (liquid) dispensing unit is held so as to face the substrate 5 via a dispenser controller (DC) 10. The dispenser 9 comprises a plurality of nozzles (not shown) that are arranged in an X-axis direction, and is configured to dispense light curable resin (resist liquid) from each of the nozzles onto the substrate 5. The dispensing of resin is controlled by the DC 10. Also, by causing the substrate stage 4 to move in an X-axis direction and a Y-axis direction, it is possible to apply resin at any position on the substrate 5. The dispenser 9 can move in a Y-axis direction from a dispenser stage 13 to a dispensing position at which to dispense light curable resin on the substrate 5 and to a retraction position to which to retract from a position at which it faces the substrate stage 4 to replace a tank in which the light curable resin is filled. At the retraction position, a first measurement unit 20 for checking a resin dispensing condition of the dispenser 9 is set.

Furthermore, in the frame 2, an alignment scope (AS) 11 is fixed so as to face the substrate 5. The AS 11 detects an alignment mark (not shown) provided in the substrate 5, and performs position adjustment between the substrate 5 and the mold 6 based on this detection result. Also, the AS 11 is a second measurement unit that detects a position by capturing a resin dispensed on the substrate 5 or on the substrate stage 4.

The stage driving unit 3, the imprint module 7, the IM driving unit 8, the DC 10, the AS 11, the dispenser stage 13, and the first measurement unit 20 described above are controlled by a central processing unit (CPU) 12, and perform a sequence of imprint operations. The CPU 12 controls an imprint operation according to the present embodiment by using a program and various data stored in a storage unit (not shown) such as a memory.

An overview of the present embodiment will be described. In a case where resin is applied to the substrate 5 from the dispenser 9, properties of individual nozzles fluctuate according to a temporal change, and thereby the resin dispensing speed changes, and it ceases to be possible to apply the resin at the desired position on the substrate 5. The resin dispensing speed here affects the time from when the CPU 12 outputs a trigger signal for dispensing the resin until when the resin is dispensed from the nozzle and lands on the substrate. Accordingly, in a case where the dispensing speed becomes slower due to the nozzle property fluctuation, this time becomes longer. Accordingly, in the present embodiment, first, a measurement of a droplet speed (the time from when the trigger signal is outputted until when the droplet passes through a predetermined position) is performed by the first measurement unit 20 which is capable of measurement in a short time when replacing the substrate 5, though the precision is low.

Also, in a case where the speed of the droplet exceeds a threshold, a shift amount of the actual resin application position is measured at higher precision by using the AS 11 (second measurement unit) which measures the droplet position by capturing in an image the resin applied to the substrate 5. Next, the resin application position shift is corrected by using the result of the measurement by the AS 11. When the effect of a temporal change of a nozzle is always measured prior to processing of the substrate 5 by the AS 11 alone, this measurement takes a long time because it is necessary to set a substrate 5 for measuring on the substrate stage 4. For that reason, the throughput decreases significantly. In other words, compared to the measurement time according to the first measurement unit 20, the measurement time according to the second measurement unit (the AS 11) takes longer. In the present embodiment, a configuration in which a measurement is performed by the second measurement unit (the AS 11) based on the result of the measurement by the first measurement unit 20 is provided. As a result, it is possible to measure the effect of a nozzle temporal change every time the substrate 5 is replaced while suppressing a decrease in throughput, and it is possible to efficiently manufacture semiconductor devices with fewer defects. Note that the threshold used when switching between the first measurement unit and the second measurement unit is assumed to be something that is defined in advance, and details thereof will be described later.

[Operational Flow]

Figure 2:
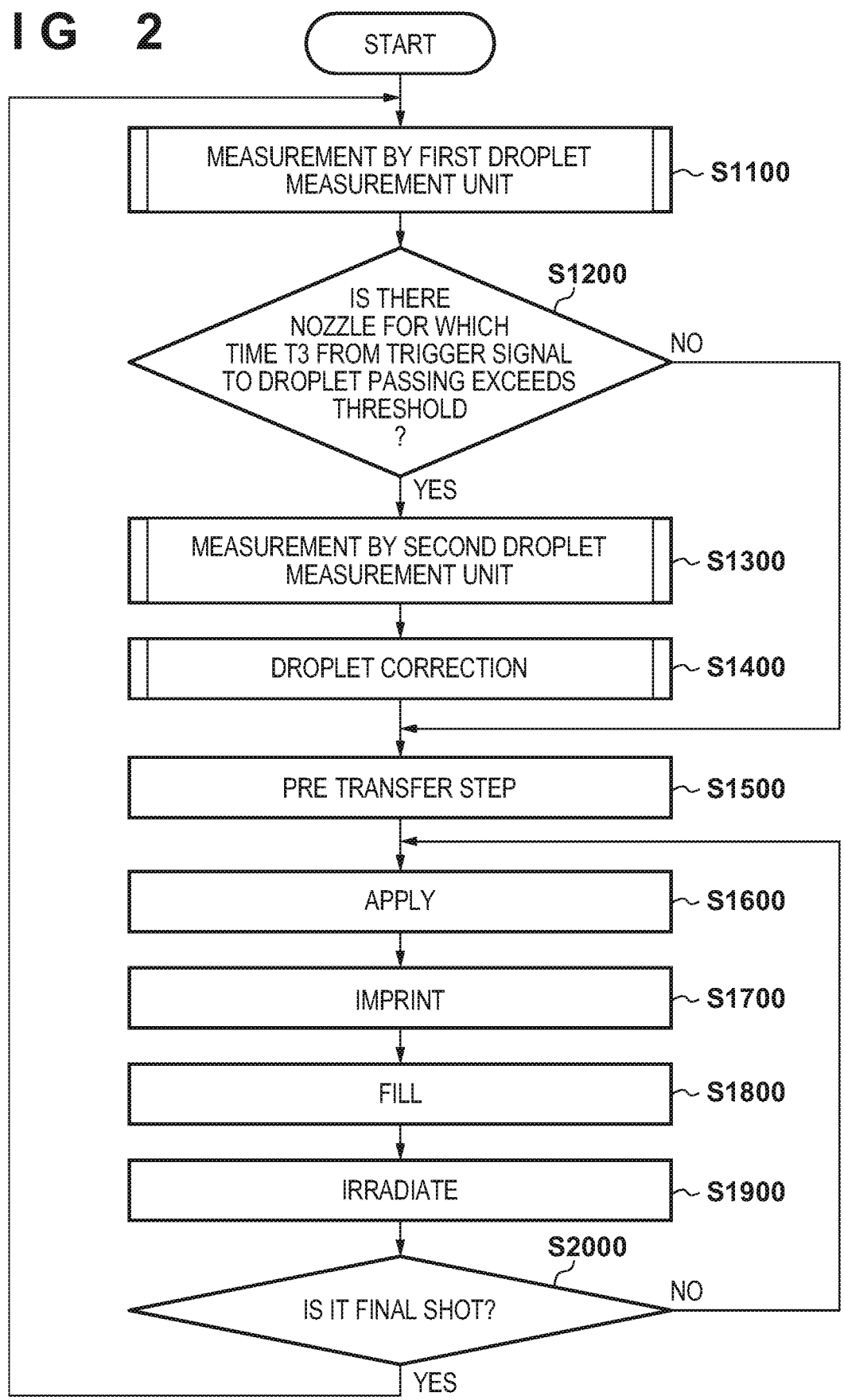
FIG. 2 is a flowchart of an operation of the imprint apparatus according to the present invention.

Using the flowchart of FIG. 2, a detailed description of operation in the imprint apparatus according to the present embodiment will be given. As described above, the operational flow is controlled by the CPU 12 using a program and various data stored in a storage unit (not shown) such as a memory.

In step S1100, the imprint apparatus performs a measurement of the resin dispensing speed by the first measurement unit 20. This operation is performed every time a new substrate 5 is set on the substrate stage 4.

Figure 3:
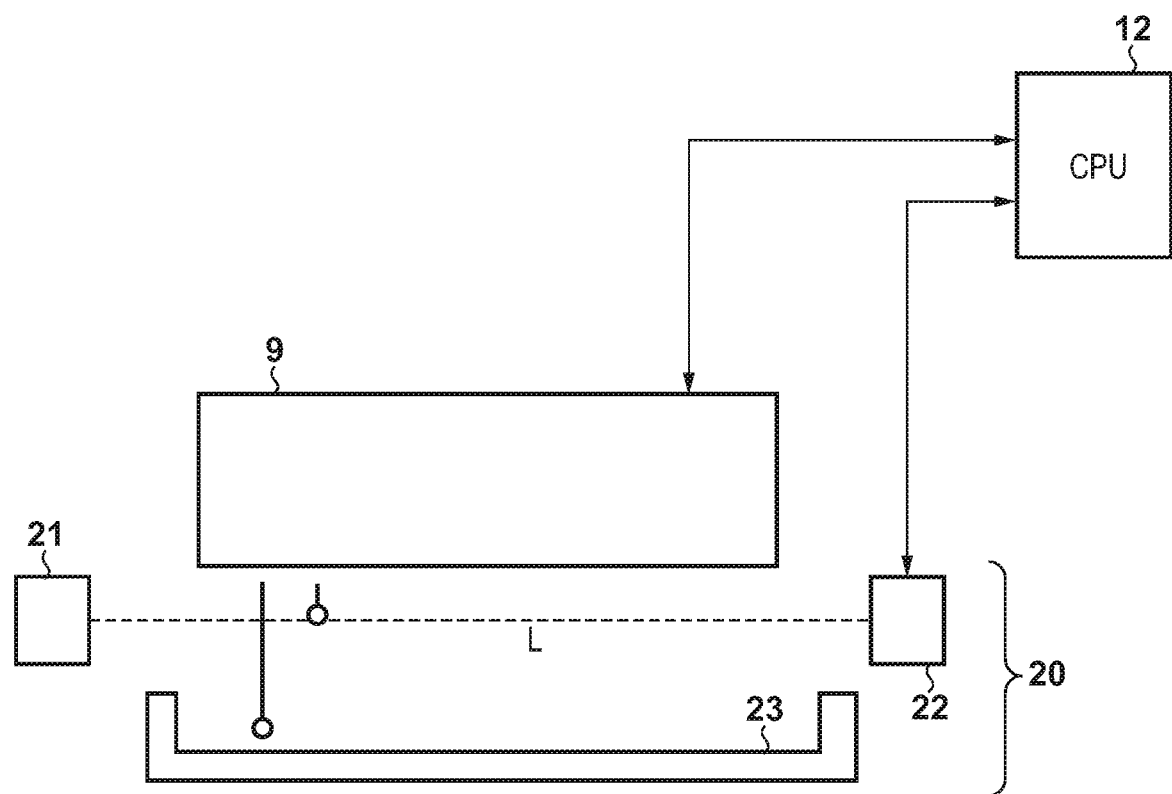
FIG. 3 is a schematic view of a first measurement unit.

FIG. 3 illustrates a state in which the dispenser 9 is positioned near the first measurement unit 20 when performing the measurement in step S1100. In other words, the dispenser 9 is in a state in which it has moved to the retraction position. The first measurement unit 20 emits a laser L from a light source 21 approximately parallel to the dispensing surface of the dispenser 9 near the dispensing surface, and detects the laser L by a photo detector 22. In FIG. 3, the dotted line indicates the laser L which is emitted from the light source 21. Also, a container 23 for receiving resin dispensed from the dispenser 9 is arranged so as to face the dispense surface.

When the dispensed resin passed through the laser L, the laser L is blocked, and light does not pass through. This light amount change is detected by the photo detector 22, and thereby it is detected that the resin passed through the laser L, and the droplet dispensing condition is detected. In the case where the resin does not pass through the laser L, a dispensing failure is determined, and a recovery operation for the dispenser 9 is performed. At that time, in the case where dispensing is being performed, but resin did not pass through the laser L within a predetermined time from which the trigger signal is outputted, it may be treated as a dispensing failure. The recovery operation is not particularly limited, but, for example, a preliminary dispensing of a predetermined amount of resin may be performed, or a suction operation may be performed.

In the case where an ink-jet method in which the dispenser 9 uses a piezoelectric element (piezoelectric device), since there is a temporal change of the piezoelectric element, the resin dispensing speed changes together with time. The result of this is that the position at which the resin is applied on the substrate 5 ends up shifting.

Figure 4A:
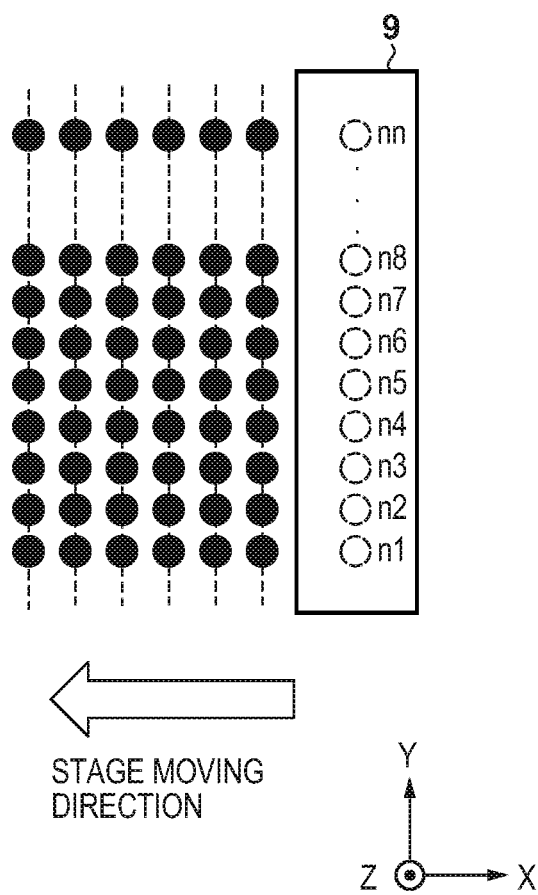
FIGS. 4A and 4B are explanatory views regarding a resin application position shift.
Figure 4B:
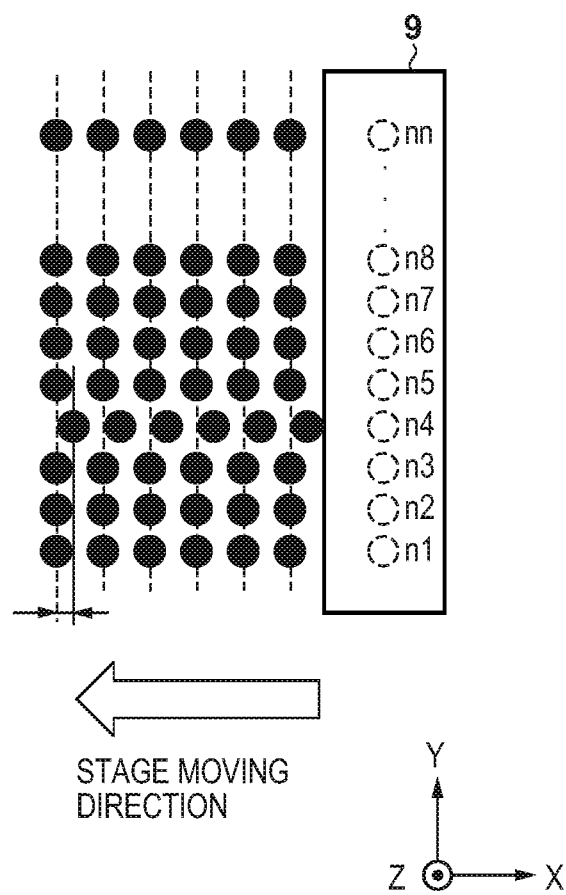

Here, the shift in the resin application position in a case where the resin dispensing speed becomes slower is described using FIGS. 4A and 4B. The XYZ axes indicated in FIGS. 4A and 4B are assumed to correspond to those indicated in FIG. 1. In the case where resin is arranged in a grid pattern, when dispensing is normal, the resin is applied to the substrate as illustrated in FIG. 4A. In the case where the substrate stage is moving in the −X direction, when the dispensing speed for the n4 nozzle decreases, the land timing becomes later, and so the position (landing position) at which the resin is applied on the substrate is shifted in the +X direction (FIG. 4B). This shift in the resin application position is connected to deterioration in resin thickness uniformity, and causes pattern defects as a result. Accordingly, it is necessary to detect the change in resin dispensing speed due to the temporal change of the piezoelectric element at high precision, and correct the resin application position shift.

Conventionally, the first measurement unit has been arranged in order to detect abnormal dispensing. However, a time T3 from when the trigger signal for applying voltage to the piezoelectric element of the dispenser 9 in order to dispense resin is outputted until when the droplet passes through the laser L can be obtained. The procedure for obtaining the time T3 will be described later. Note that in FIGS. 4A and 4B, an example in which a shift occurs in only one of the plurality of nozzles (n1 to nn) that the dispenser 9 is provided with is illustrated, but there are cases where a shift occurs simultaneously in two or more nozzles, and the shift amounts in the respective nozzles in such a case are not necessarily fixed.

In step S1200, the imprint apparatus, for each nozzle, performs a determination as to whether or not the time T3 obtained in step S1100 exceeds a particular threshold. Here, as described above, the time T3 indicates a time from when the trigger signal is outputted until when the droplet passes through the laser L. In a case where there is a nozzle for which T3 exceeds the particular threshold (YES in step S1200), step S1300 is advanced to. In a case where there is no nozzle for which T3 exceeds the threshold (NO in step S1200), it is not necessary to perform a correction of the position at which the resin is applied, and step S1500 is advanced to. Here, in the case where T3 exceeds the threshold for even one of the plurality of nozzles, it is assumed that the processing of step S1300 is performed.

In step S1300, the imprint apparatus performs droplet measurement by the second measurement unit (the AS 11) to obtain the specific position of the resin applied on the substrate 5. Here, the resin applied on the substrate 5 is captured, and the resin position is measured. Details of the droplet measurement method by the second measurement unit will be described later using FIG. 7A.

In step S1400, the imprint apparatus performs correction of the resin application position by shifting the dispensing timing based on the shift amount ΔX of the resin application position for each nozzle obtained in step S1300. The method of correcting the resin application position will be described later using FIG. 7B.

In step S1500, the imprint apparatus performs a pre-transfer step. Here, a processed substrate 5 is unloaded from a pre-processing apparatus (not shown) such as a cleaning apparatus, and the substrate 5 (semiconductor wafer) is conveyed onto the substrate stage 4 by a conveying unit (not shown). After the substrate 5 is carried onto the substrate stage 4, an alignment mark (not shown) on the substrate 5 (semiconductor wafer) is detected by the AS 11, and position adjustment processing between the mold 6 and the semiconductor wafer is performed. Position adjustment processing can be performed at high precision by using a known method recited in Japanese Patent Laid-Open No. 2008-100507 or Japanese Patent Laid-Open No. 2007-281072, for example.

In step S1600, the imprint apparatus, using the dispensing timing correction value, dispenses resin liquid from the dispenser 9, and thereby applies resin to a desired region. The dispensing timing correction value will be described later by using FIGS. 7A and 7B.

In step S1700, the imprint apparatus controls the IM driving unit 8 to cause the imprint module 7 to move in a downward direction in the Z-axis, and presses (imprints) the mold 6 to a shot region S of the substrate 5 (semiconductor wafer) to which the resin was applied.

In step S1800, the imprint apparatus further pushes down the mold 6 to perform fill processing such that resin spreads through the details of the uneven pattern formed on the surface of the mold 6.

In step S1900, the imprint apparatus uses the ultraviolet light irradiation unit (not shown) integrated into the imprint module 7 to irradiate ultraviolet light onto the resin through the mold 6. By irradiating the ultraviolet light, the resin filled into the mold 6 is cured. After that, the imprint apparatus controls the IM driving unit 8 to cause the imprint module 7 to move in an upward direction in the Z-axis, and pulls (detaches) the mold 6 from the semiconductor wafer (the substrate 5).

In step S2000, the imprint apparatus determines whether or not the preceding transfer processing is the final shot, in other words whether or not transfer processing was performed on all shot regions S of the substrate 5 (the semiconductor wafer). In the case where it is determined that pattern transfer to all of the shot regions S has completed (YES in step S2000), this processing flow is terminated. In the case where it is determined that pattern transfer to all of the shot regions S has not yet completed (NO in step S2000), step S1600 is returned to and this processing is repeated.

Figure 5:
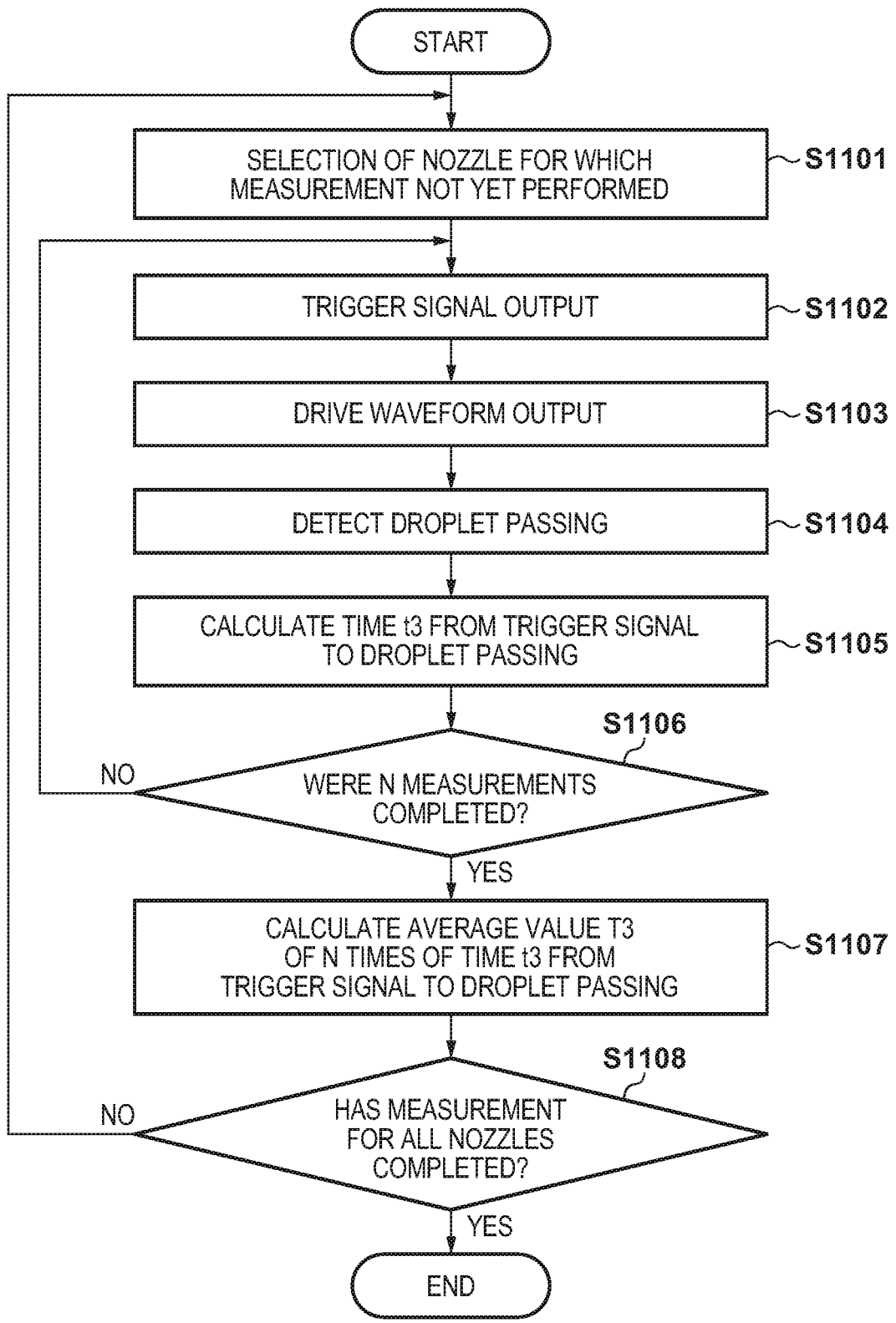
FIG. 5 is a flowchart of a measurement by the first measurement unit.

Details of step S1100 of FIG. 2 will be described using FIG. 5.

In step S1101, the imprint apparatus selects one nozzle for which measurement has yet to be performed in order to perform measurement one by one for the plurality of nozzles that the dispenser 9 comprises.

In step S1102, the imprint apparatus sends a trigger signal to the DC 10 from the CPU 12 in order to dispensing resin from the nozzle selected in step S1101.

Figure 6:
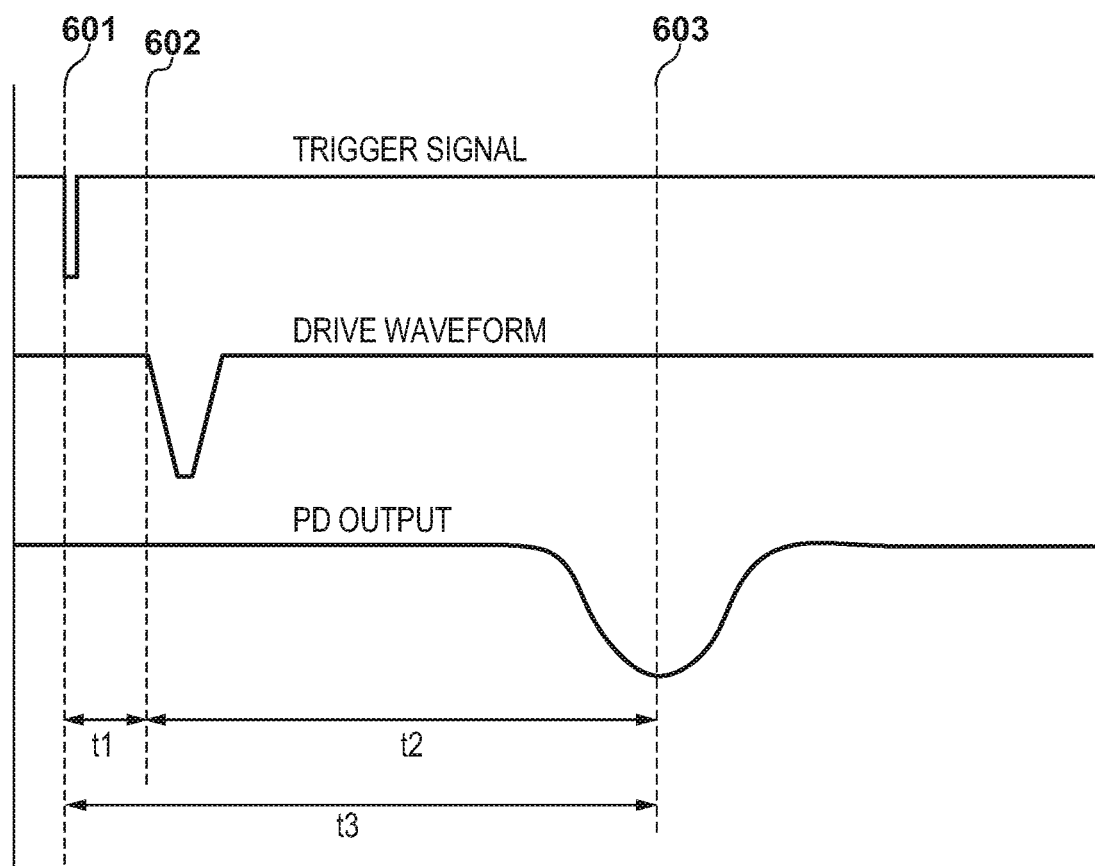
FIG. 6 is a view that illustrates a droplet passing timing in the first measurement unit.

In step S1103, in the imprint apparatus, the DC 10, after receiving the trigger signal, dispenses resin by applying a driving voltage for driving the piezoelectric element in relation to the selected nozzle. FIG. 6 illustrates an example of a driving voltage. Regarding the driving voltage, first the voltage is lowered, and liquid is drawn into the nozzle, and then simultaneously to the liquid surface returning, the voltage for the piezoelectric element is increased, and by using the momentum when the liquid surface returns, the liquid is pushed out and dispensed.

In step S1104, in the imprint apparatus, the dispensed resin passes through the laser L, and the photo detector 22 detects the droplet. As described above, when the resin passes through the laser L, the laser L is blocked, and therefore the output of the photo detector 22 decreases when the droplet passes through, as illustrated in the PD output of FIG. 6. By detecting this, the photo detector 22 can detect the droplet.

In step S1105, the imprint apparatus calculates a time t3 from the trigger signal until when the droplet passes. As illustrated in FIG. 6, the time t3 from a timing 601 of the trigger signal until a timing 603 at which the droplet passes through the laser L is calculated. The time t3 is the sum of the time t1 from the timing 601 of the trigger signal until a timing 602 when an activation signal is inputted and the time t2 from the timing 602 until the timing 603.

In step S1106, the imprint apparatus determines whether or not a predetermined number (N times) of measurements were performed on the same nozzle. If so (YES in step S1106), the processing advances to step S1107, and if not (NO in step S1106), the processing advances to step S1102. Note that the predetermined number of times N is not particularly limited, and it may be specified that one or more measurements be performed in accordance with detection time and processing precision.

In step S1107, the imprint apparatus calculates the average value T3 of the t3 results of the N measurements.

In step S1108, the imprint apparatus determines whether or not measurement has completed for all of the plurality of nozzles that the dispenser 9 comprises. When it has completed (YES in step S1108), this processing flow is completed. When it has not completed (NO in step S1108), step S1101 is returned to, and measurement is performed in sequence for the unmeasured nozzles.

By the method described above, the time T3 from the trigger signal until when the droplet passes through the laser L is obtained, and measurement by the first droplet measurement unit 20 completes.

Next, details of step S1300 of FIG. 2 will be described using FIG. 7A.

In step S1301, the imprint apparatus measures the resin applied on the substrate 5 by the AS 11 (second droplet measurement unit). Here, it is assumed that the substrate 5 for measurement is loaded, and setting onto the substrate stage 4 is performed.

In step S1302, the imprint apparatus performs application of resin onto the substrate 5. The application of resin is performed by controlling the DC 10 by the CPU 12.

In step S1303, the imprint apparatus controls the stage driving unit 3 by the CPU 12, and for calibration, the substrate stage 4 is moved so that the region to which the resin droplet is applied is positioned immediately under the AS 11. Then, the imprint apparatus is caused to detect (measure) the resin position by capturing of the region in which the applied resin is present by the AS 11.

In step S1304, the imprint apparatus calculates the shift amount $\Delta X$ from a reference position of the resin application position based on the result of the detection by the AS 11. The method of calculating $\Delta X$ is described using FIGS. 4A and 4B. Here, the n4 nozzle is illustrated as an example. The resin dispensing speed for the n4 nozzle becomes slower due to the temporal change, and because of the delay in the droplet reaching the substrate 5, the resin is shifted in the −x direction which is opposite to the direction of movement of the substrate stage 4, as in FIG. 4B. When the reference position is made to be the average in the x direction of the line of resin dispensed simultaneously, the reference positions are represented by dotted lines in FIGS. 4A and 4B. The application of resin of the n4 nozzle is shifted by $\Delta X$ in relation to the reference position. It is possible to obtain $\Delta X$ for other nozzles similarly. This processing flow is then terminated.

Next, details of step S1400 of FIG. 2 will be described using FIG. 7B.

Figure 7A:
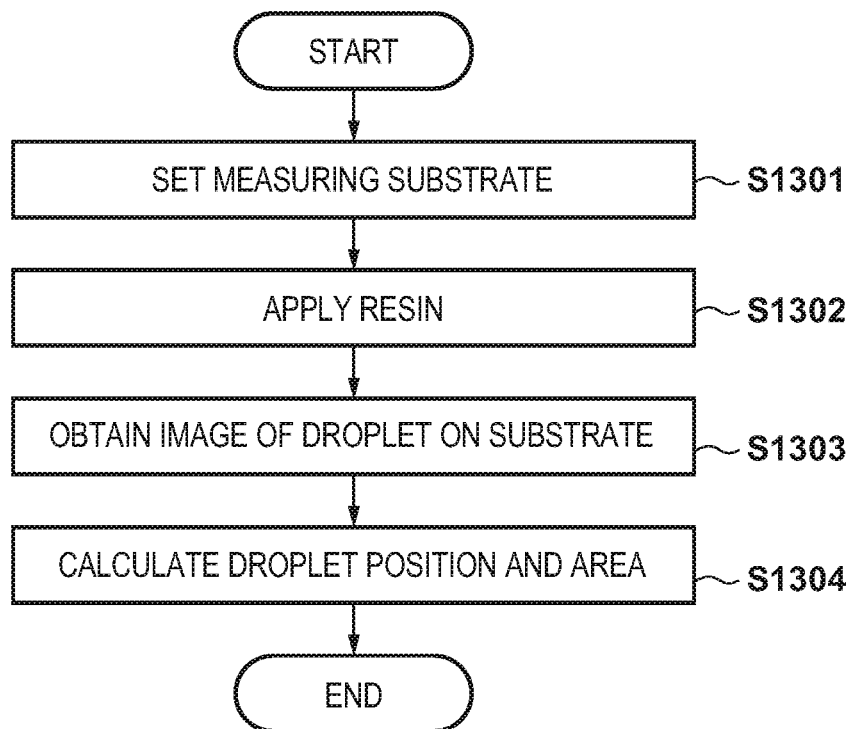
FIGS. 7A and 7B are explanatory views regarding a second measurement unit and a droplet application position correction method.
Figure 7B:
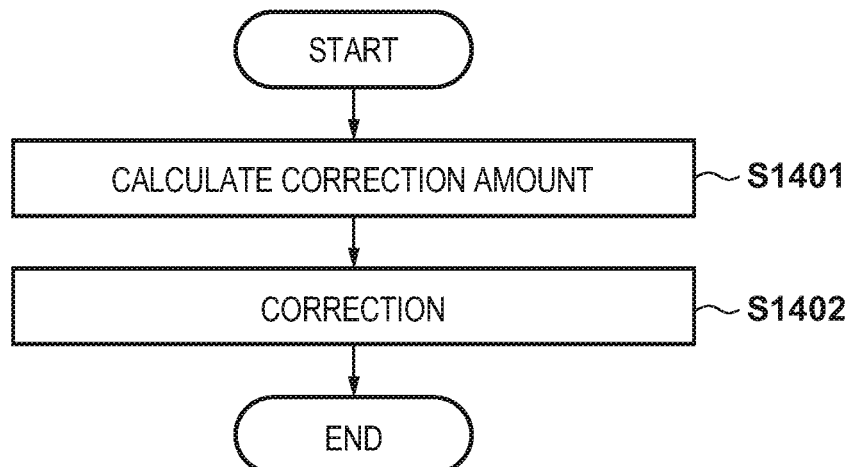

In step S1401, the imprint apparatus stores the shift amount $\Delta X$ calculated in step S1304 of FIG. 7A by the CPU 12 in memory (not shown) as a correction value. Furthermore, the CPU 12, by dividing the resin application position shift amount $\Delta X$ calculated in step S1304 by the movement speed p[m/s] of the substrate stage 4, the resin dispensing timing correction amount $\Delta t$ is calculated for each nozzle. For example, in a case where $\Delta X$ is 5 μm, and the movement speed of the substrate stage 4 is 1 m/s, the amount of correction of the resin dispensing timing is 5 μs.

In step S1402, the imprint apparatus stores in a memory (not shown) the correction amount $\Delta t$ for the dispensing timing calculated for each nozzle by the CPU 12. Furthermore, the CPU 12 uses a waveform that causes the stored correction value to be reflected when applying the resin onto the substrate 5 in step S1600. This processing flow is then terminated.

By performing imprinting by the foregoing method, it is possible to measure the effect of nozzle temporal change prior to processing of the substrate 5 while suppressing a throughput decrease. As a result, it is possible to manufacture a semiconductor device with few defects efficiently.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A liquid dispensing apparatus comprising:
   a dispensing unit configured to dispense a liquid to a medium;
   a first measurement unit configured to measure a condition of the liquid dispensed by the dispensing unit;
   a second measurement unit configured to measure a position of the liquid on the medium that is dispensed by the dispensing unit; and
   a control unit configured to perform measurement by the second measurement unit based on a measurement result by the first measurement unit.

2. The liquid dispensing apparatus according to claim 1, wherein the first measurement unit comprises a light source arranged below the dispensing unit and configured to emit a laser, and a detector configured to detect the laser.

3. The liquid dispensing apparatus according to claim 1, wherein the dispensing unit is configured to move to a facing position where the dispensing unit dispenses the liquid with facing the medium and a retraction position where the dispensing unit does not face the medium, and
   wherein measurement by the first measurement unit is performed when the dispensing unit is positioned at the retraction position.

4. The liquid dispensing apparatus according to claim 1, wherein the dispensing unit comprises a plurality of nozzles, which dispense the liquid by driving piezoelectric elements.

5. The liquid dispensing apparatus according to claim 1, wherein the first measurement unit is configured to measure, as the condition, a speed of the liquid dispensed by the dispensing unit.

6. The liquid dispensing apparatus according to claim 1, wherein the first measurement unit is configured to measure, as the condition, a time from a timing when a signal causing the dispensing unit to dispense the liquid is outputted to the dispensing unit to a timing when the liquid dispensed by the dispensing unit passes through a predetermined position.

7. The liquid dispensing apparatus according to claim 6, wherein the control unit performs the measurement by the second measurement unit in a case where the time measured by the first measurement unit exceeds a predetermined threshold and does not perform the measurement by the second measurement unit in a case where the time measured by the first measurement unit does not exceed the predetermined threshold.

8. The liquid dispensing apparatus according to claim 1, wherein the control unit is configured to determine that a dispensing failure occurred for the dispensing unit in a case where the first measurement unit does not detect the liquid from the dispensing unit within a predetermined time.

9. The liquid dispensing apparatus according to claim 1, further comprising an imprint module configured to transfer a pattern of a mold to a substrate as the medium.

10. A method of controlling a liquid dispensing apparatus including a dispensing unit configured to dispense a liquid to a medium, the method comprising:
    performing a first measurement of a condition of the liquid dispensed by the dispensing unit; and
    performing a second measurement of a position of the liquid on the medium that is dispensed by the dispensing unit based on a measurement result of the first measurement.

11. The liquid dispensing apparatus according to claim 4, wherein the first measurement unit performs measurement with respect to each of the plurality of nozzles.

12. The liquid dispensing apparatus according to claim 9, the second measurement unit is an alignment scope configured to perform position adjustment between the mold and the substrate.

13. An imprint apparatus comprising:
    a dispensing unit configured to dispense a liquid to a substrate;
    a light source arranged below the dispensing unit and configured to emit laser;
    a detecting unit configured to detect the laser and to measure a condition of the liquid dispensed by the dispensing unit;
    a scope configured to measure a position of the liquid on the substrate that is dispensed by the dispensing unit; and
    a control unit configured to perform measurement by the scope based on a measurement result by the detecting unit.

14. The imprint apparatus according to claim 13, wherein the dispensing unit is configured to move to a facing position where the dispensing unit dispenses the liquid with facing the substrate and a retraction position where the dispensing unit does not face the substrate, and
    wherein measurement by the detecting unit is performed when the dispensing unit is positioned at the retraction position.

15. The imprint apparatus according to claim 13, wherein the dispensing unit comprises a plurality of nozzles, which dispense the liquid by driving piezoelectric elements.

16. The imprint apparatus according to claim 15, wherein the detecting unit performs measurement with respect to each of the plurality of nozzles.

17. The imprint apparatus according to claim 13, wherein the detecting unit is configured to measure, as the condition, a speed of the liquid dispensed by the dispensing unit.

18. The imprint apparatus according to claim 13, wherein the detecting unit is configured to measure, as the condition, a time from a timing when a signal causing the dispensing unit to dispense the liquid is outputted to the dispensing unit to a timing when the liquid dispensed by the dispensing unit passes through a predetermined position.

19. The imprint apparatus according to claim 18, wherein the control unit performs the measurement by the scope in a case where the time measured by the detecting unit exceeds a predetermined threshold and does not perform the measurement by the scope in a case where the time measured by the detecting unit does not exceed the predetermined threshold.

20. The imprint apparatus according to claim 13, wherein the control unit is configured to determine that a dispensing failure occurred for the dispensing unit in a case where the detecting unit does not detect the liquid from the dispensing unit within a predetermined time.

21. The imprint apparatus according to claim 13, further comprising an imprint module configured to transfer a pattern of a mold to a work substrate as the substrate.

22. The imprint apparatus according to claim 21, wherein the scope is configured to perform position adjustment between the mold and the substrate.

* * * * *